(12) United States Patent
Kim et al.

(10) Patent No.: US 9,648,753 B2
(45) Date of Patent: May 9, 2017

(54) FLEXIBLE PRINTED CIRCUIT BOARD AND METHOD FOR MANUFACTURING SAME

(71) Applicant: AMOGREENTECH CO., LTD., Gimpo-si (KR)

(72) Inventors: Jong-Soo Kim, Yongin-si (KR); Kyung-Hoon Lee, Paju-si (KR); Jeong-Sang Yu, Gunpo-si (KR); O-Chung Kwon, Cheongwon-gun (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 14/758,753

(22) PCT Filed: Dec. 31, 2013

(86) PCT No.: PCT/KR2013/012410
§ 371 (c)(1),
(2) Date: Jun. 30, 2015

(87) PCT Pub. No.: WO2014/104860
PCT Pub. Date: Jul. 3, 2014

(65) Prior Publication Data
US 2015/0359106 A1    Dec. 10, 2015

(30) Foreign Application Priority Data

Dec. 31, 2012 (KR) .................. 10-2012-0158512
Dec. 31, 2013 (KR) .................. 10-2013-0168119

(51) Int. Cl.
H05K 1/00    (2006.01)
H05K 3/20    (2006.01)
(Continued)

(52) U.S. Cl.
CPC ............ *H05K 3/207* (2013.01); *H05K 1/028* (2013.01); *H05K 1/0326* (2013.01);
(Continued)

(58) Field of Classification Search
CPC ... H05K 1/02; H05K 1/09; H05K 1/11; H05K 1/18; H05K 1/20; H05K 3/00; H05K 3/07;
(Continued)

(56) References Cited

U.S. PATENT DOCUMENTS 4,090,231 A *  5/1978  Millard ............... H01G 9/0029
                                                              361/529
4,595,604 A *  6/1986  Martin ..................... C08K 3/08
                                                              252/514
(Continued)

FOREIGN PATENT DOCUMENTS

JP        10051095 A     2/1998
JP      2005050965 A     2/2005
(Continued)

Primary Examiner — Xiaoliang Chen
(74) Attorney, Agent, or Firm — Baker & Hostetler LLP

(57) ABSTRACT

The present invention relates to a method for manufacturing a flexible printed circuit board and a flexible printed circuit board manufactured by using the same. A circuit pattern is formed with a conductive paste on one surface of a base material, and the circuit pattern is sintered at a temperature of 290° C. to 420° C. to manufacture the flexible printed circuit board. As such, manufacturing costs can be reduced and productivity can be improved through a simple yet convenient process. Also, the circuit pattern is formed without a plating process, such that the problem of circuit pattern separation occurring during the plating process can be addressed and product reliability can be improved.

5 Claims, 2 Drawing Sheets

(51) Int. Cl.
*H05K 1/09* (2006.01)
*H05K 1/02* (2006.01)
*H05K 1/03* (2006.01)
*H05K 1/11* (2006.01)
*H05K 3/12* (2006.01)

(52) U.S. Cl.
CPC .......... *H05K 1/0346* (2013.01); *H05K 1/092* (2013.01); *H05K 1/118* (2013.01); *H05K 1/0287* (2013.01); *H05K 3/12* (2013.01); *H05K 2201/0145* (2013.01); *H05K 2201/0154* (2013.01)

(58) Field of Classification Search
CPC . H05K 3/40; H05K 3/46; H01L 21/00; H01L 21/02; H01L 21/60; H01L 23/48; H01L 23/50; H01L 31/02; H01L 31/05; H01L 31/18; H01L 31/42; H01L 31/48; H01L 31/0224; C23F 1/00
USPC ....... 174/254, 250, 255, 257, 260–263, 350, 174/389; 156/231, 247; 29/825, 830, 29/846, 847; 361/761
See application file for complete search history.

(56) References Cited

U.S. PATENT DOCUMENTS

| | | | | | |
|---|---|---|---|---|---|
| 4,595,605 | A * | 6/1986 | Martin | .................. | C04B 41/009 252/514 |
| 5,428,249 | A * | 6/1995 | Sawayama | ...... | H01L 31/022425 136/256 |
| 5,600,103 | A * | 2/1997 | Odaira | .................. | H05K 3/4069 174/255 |
| 5,697,192 | A * | 12/1997 | Inoue | .................... | F24J 2/5205 136/251 |
| 5,744,758 | A * | 4/1998 | Takenouchi | ...... | H01L 23/49827 174/255 |
| 5,860,212 | A * | 1/1999 | Matsuhira | .............. | H05K 3/245 29/840 |
| 5,919,325 | A * | 7/1999 | Goebel | ............. | H01L 23/49883 156/89.12 |
| 5,951,918 | A * | 9/1999 | Kuwajima | ................ | H01B 1/02 174/257 |
| 6,022,611 | A | 2/2000 | Sakurai et al. | | |
| 6,074,893 | A * | 6/2000 | Nakata | ................ | H01L 21/4867 29/877 |
| 6,156,433 | A * | 12/2000 | Hatori | ...................... | H01J 9/02 428/411.1 |
| 6,184,457 | B1 * | 2/2001 | Tsuzuki | .............. | H01L 31/0512 136/244 |
| 6,184,477 | B1 * | 2/2001 | Tanahashi | ................ | H01L 23/50 174/261 |
| 6,333,140 | B1 * | 12/2001 | Hatori | ...................... | H01J 9/02 430/256 |
| 6,800,223 | B2 * | 10/2004 | Kojo | ........................ | H01B 1/22 252/514 |
| 6,848,178 | B2 * | 2/2005 | Kondo | .................. | H01L 23/498 174/266 |
| 9,039,941 | B2 * | 5/2015 | Inagaki | .................. | B22F 1/0022 252/512 |
| 2001/0044043 | A1 * | 11/2001 | Badding | ............ | H01M 4/8605 429/488 |
| 2002/0048730 | A1 * | 4/2002 | Hatori | ...................... | H01J 9/02 430/322 |
| 2002/0056509 | A1 * | 5/2002 | Miura | .................... | H05K 3/207 156/231 |
| 2003/0038280 | A1 * | 2/2003 | Kojo | ........................ | H01B 1/22 252/514 |
| 2003/0133275 | A1 * | 7/2003 | Miyake | .................. | H05K 1/162 361/761 |
| 2003/0199114 | A1 * | 10/2003 | Fukagawa | ............ | G02F 1/1339 438/29 |
| 2004/0111854 | A1 * | 6/2004 | Kamimura | ................ | B09B 5/00 29/403.3 |
| 2004/0129542 | A1 * | 7/2004 | Kawaguchi | ............ | H01H 9/182 200/61.1 |
| 2004/0239730 | A1 * | 12/2004 | Kurosawa | .................. | B41J 2/01 347/68 |
| 2005/0034560 | A1 * | 2/2005 | Kuwajima | ............ | B22F 1/0003 75/255 |
| 2005/0087363 | A1 * | 4/2005 | Tsukahara | .............. | H05K 3/249 174/257 |
| 2005/0122030 | A1 * | 6/2005 | Sakamoto | ................ | H01J 9/02 313/496 |
| 2005/0246879 | A1 * | 11/2005 | Kamimura | ................ | B09B 5/00 29/403.3 |
| 2006/0044098 | A1 * | 3/2006 | Kimura | .................... | H01B 1/22 336/122 |
| 2006/0107791 | A1 * | 5/2006 | Fujino | .................. | B22F 1/0011 75/365 |
| 2006/0118233 | A1 * | 6/2006 | Wargo | .................. | H05K 3/1258 156/247 |
| 2006/0145125 | A1 * | 7/2006 | Kuwajima | ................ | H01B 1/22 252/500 |
| 2007/0069393 | A1 * | 3/2007 | Asahi | .................. | H01L 23/5389 257/780 |
| 2007/0164260 | A1 * | 7/2007 | Kuwajima | ................ | H01B 1/02 252/512 |
| 2007/0181945 | A1 * | 8/2007 | Nakamura | .......... | H01L 27/1292 257/347 |
| 2007/0226994 | A1 * | 10/2007 | Wollach | .................. | C25D 5/022 29/825 |
| 2008/0134936 | A1 * | 6/2008 | Kamikoriyama | ...... | C09D 11/52 106/31.92 |
| 2009/0008142 | A1 * | 1/2009 | Shimizu | .................... | B32B 5/18 174/261 |
| 2009/0032293 | A1 * | 2/2009 | Miyakawa | ............. | C08G 59/66 174/257 |
| 2009/0057265 | A1 * | 3/2009 | Shiraishi | .............. | H05K 3/4046 216/18 |
| 2009/0086450 | A1 * | 4/2009 | Matsui | .................. | H05K 3/4691 361/761 |
| 2009/0104565 | A1 * | 4/2009 | Nakashiba | ............. | G02B 6/136 430/312 |
| 2009/0133922 | A1 * | 5/2009 | Okazaki | ............... | H05K 9/0096 174/389 |
| 2009/0146117 | A1 * | 6/2009 | Suenaga | ................ | B22F 1/0062 252/520.3 |
| 2009/0165296 | A1 * | 7/2009 | Carmi | .................. | H01P 11/003 29/847 |
| 2009/0236404 | A1 * | 9/2009 | Yamakawa | ............. | B22F 1/004 228/123.1 |
| 2009/0317968 | A1 * | 12/2009 | Nagata | .................... | H01L 27/12 438/600 |
| 2010/0025088 | A1 * | 2/2010 | Kamata | .................. | H05K 3/102 174/256 |
| 2010/0093131 | A1 * | 4/2010 | Maeda | .................. | B23K 1/0016 438/107 |
| 2010/0129532 | A1 * | 5/2010 | Bai | ...................... | C23C 18/1608 427/97.4 |
| 2010/0193748 | A1 * | 8/2010 | Hama | .................... | C08L 79/08 252/503 |
| 2010/0233011 | A1 * | 9/2010 | Nakako | .................. | H01B 1/026 419/9 |
| 2010/0269893 | A1 * | 10/2010 | Prince | .................. | B23K 1/0016 136/252 |
| 2010/0316794 | A1 * | 12/2010 | Miyakawa | ................ | C08G 59/66 427/99.2 |
| 2011/0005822 | A1 * | 1/2011 | Momokawa | .......... | H01L 21/563 174/260 |
| 2011/0122596 | A1 * | 5/2011 | Miyazaki | ............... | H05K 9/0096 361/818 |
| 2012/0219453 | A1 * | 8/2012 | Fujino | .................. | B22F 1/0011 420/501 |
| 2012/0247817 | A1 * | 10/2012 | Hommura | ................ | H01B 1/02 174/257 |
| 2012/0301162 | A1 * | 11/2012 | Sasaki | ................... | G03G 15/2042 399/33 |

(56) References Cited

U.S. PATENT DOCUMENTS

| | | | | |
|---|---|---|---|---|
| 2012/0305065 A1* | 12/2012 | Dorfman | ................ | H01B 1/22 |
| | | | | 136/256 |
| 2012/0318346 A1* | 12/2012 | Miyashita | ............ | H01G 9/2068 |
| | | | | 136/256 |
| 2013/0048920 A1* | 2/2013 | Inagaki | ................ | B22F 1/0022 |
| | | | | 252/512 |
| 2013/0056687 A1* | 3/2013 | Inagaki | ................ | B22F 1/0018 |
| | | | | 252/512 |
| 2014/0145122 A1* | 5/2014 | Sawai | .................... | H01J 29/90 |
| | | | | 252/514 |
| 2014/0242362 A1* | 8/2014 | Nakako | ................... | C09J 11/04 |
| | | | | 428/215 |

FOREIGN PATENT DOCUMENTS

| | | |
|---|---|---|
| JP | 2006066838 A | 3/2006 |
| JP | 2006318711 A | 11/2006 |
| KR | 1020010077345 A | 8/2001 |
| KR | 1020050017905 A | 2/2005 |
| KR | 1020070048257 A | 5/2007 |
| KR | 1020120099162 A | 9/2012 |
| KR | 101199676 B1 | 11/2012 |

\* cited by examiner

FLEXIBLE PRINTED CIRCUIT BOARD AND METHOD FOR MANUFACTURING SAME

TECHNICAL FIELD

The present invention relates to a flexible printed circuit board and a method for manufacturing the same. More particularly, the present invention relates to a flexible printed circuit board in which a circuit pattern is formed by printing conductive paste, and sintering the printed conductive paste at a low temperature, and a method for manufacturing the same.

CROSS-REFERENCE TO RELATED APPLICATION

This application claims priority to international application PCT/KR2013/012410, filed Dec. 31, 2013, which claim the priority of Korean Patent Application No. 10-2012-0158512, filed on Dec. 31, 2012 and Korean Patent Application No. 10-2013-0168119, filed on Dec. 31, 2013, which are hereby incorporated by reference in their entirety into this application.

BACKGROUND

Generally, a flexible printed circuit board is a bendable board based on a thin insulating film on which a circuit pattern is formed. At present, flexible printed circuit boards find applications in many fields including mobile electronic equipment, and automatic instruments and displays in which some electronic parts must be bent or flexible for their operation.

Particularly, there has been a sharp demand on flexible printed circuit boards for mobile terminals such as smart phones. For example, flexible printed circuit boards are used in NFC (Near Field Communication) antennas or digitizers of mobile terminals.

When installed in a display panel of electronic equipment, such as cellular phones, PDAs, laptop computers, etc., a digitizer functions to recognize and represent coordinates of touch points on the display panel, allowing for the natural representation of written letters or notes on the display panel.

Accordingly, the size of digitizers complies with that of display panels. With the tendency of display panels toward enlargement, such as in smart phones, tablet PCs, outdoor advertisement displays, etc., digitizers have gradually increased in size.

Typically, a flexible printed circuit board is manufactured by etching a copper foil laminated on a flexible insulation film, or by printing conductive paste or ink into a circuit pattern on an insulation film and then plating the circuit pattern.

However, such an etching or plating process makes the manufacture of flexible printed circuit boards complex and increases the production cost.

DISCLOSURE

Accordingly, the present invention has been made keeping in mind the above problems occurring in the prior art, and an object of the present invention is to provide a flexible printed circuit board that can be manufactured in a simple process at low cost, and a manufacturing method thereof, characterized by a screen printing technique in which conductive paste is printed into a circuit pattern on a substrate, and then sintered.

Another object of the present invention is to provide a flexible printed circuit board that meets standards for electric properties (e.g., resistivity); and in which the circuit pattern is superior in bond strength with regard to a substrate, thus guaranteeing the excellent reliability of the final product, and a method for manufacturing the same using a screen printing technique in which conductive paste compositions and sintering temperatures are controlled.

In order to accomplish the above objects, an aspect of the present invention provides a flexible printed circuit board comprising: a substrate and a circuit pattern printed with conductive paste on one side of the substrate, the conductive paste being sintered at 290° C.~420° C.

In one exemplary embodiment of the present invention, the substrate may be a polyimide film.

In another exemplary embodiment of the present invention, the circuit pattern is a coordinate pattern in a grid form, composed of a plurality of intersecting X-Y axes.

In another exemplary embodiment of the present invention, the conductive paste may be silver paste comprising a silver powder in an amount of 73 wt %~88 wt %, a polymer resin in an amount of 5.9 wt %~9.5 wt %, and a solvent in an amount of 5.7 wt %~18.0 wt %.

In another exemplary embodiment of the present invention, the silver paste may further comprise a dispersant in an amount of 0.35 wt %~2.90 wt %.

In another exemplary embodiment of the present invention, the silver powder may range in diameter from 0.1 to 4.5 µm, and preferably from 0.2 to 3.0 µm.

In another exemplary embodiment of the present invention, the silver powder has a mean particle size of from 0.5 to 2.3 µm, and preferably from 0.5 to 1.2 µm.

In another exemplary embodiment of the present invention, the polymer resin may be a polyester-based resin.

In another exemplary embodiment of the present invention, the circuit pattern may have a specific resistivity of 4.0 µΩ·cm to 6.5 µΩ·cm.

According to another aspect thereof, the present invention provides a method for manufacturing a flexible printed circuit board, comprising: forming a circuit pattern with conductive paste on one side of a substrate; and sintering the circuit pattern at 290° C.~420° C.

In one exemplary embodiment of the present invention, the sintering of the circuit pattern may be carried out at 310° C.~410° C.

In another exemplary embodiment of the present invention, the sintering of the circuit pattern may be carried out for a period of 10 min~35 min, and preferably for a period of 20 min to 30 min.

Compared to conventional etching techniques for FCCL, as described above, the present invention can manufacture a flexible printed circuit board more simply and easily, and thus at lower production cost with higher productivity.

Capable of forming a circuit pattern without a plating process, the present invention is free of the problem of circuit pattern delamination encountered with a plating process, and thus can improve the reliability of the final product.

Since the circuit pattern meets the resistivity standard after sintering even at a low temperature, the present invention avoids the problems of heat generation and power consumption.

DESCRIPTION OF THE REFERENCE NUMERALS IN THE DRAWINGS

10: substrate
20: circuit pattern

Preferred embodiments of the present invention will be explained, with reference to the accompanying drawings.

In accordance with an aspect thereof, the present invention addresses a flexible printed circuit board comprising: a substrate; and a circuit pattern printed with conductive paste on one side of the substrate.

The circuit pattern is formed by sintering conductive paste at 290° C.~420° C.

Preferably, the substrate is preferably a polyimide (PI) film. Polyimide films have sufficiently high thermal resistance to allow for sintering the circuit pattern at a temperature of 290° C.~420° C. In addition, polyimide films are inexpensive, and can be made thin, with excellent flexibility.

At the sintering temperature of from 290° C. to 420° C., a circuit pattern can be sintered without deforming or damaging the substrate, that is, the polyimide film. In addition, the sintering temperature range provides the circuit pattern printed from conductive paste with a predetermined range of specific resistivity, and with bonding strength equal to or higher than a critical value. The sintering temperature range will be in greater detail explained, together with a method for manufacturing a flexible printed circuit board, with reference to test data, later.

The circuit pattern is a coordinate pattern. In one exemplary embodiment, the coordinate pattern may be a grid pattern consisting of a plurality of intersecting X-Y axes.

Figure 1:
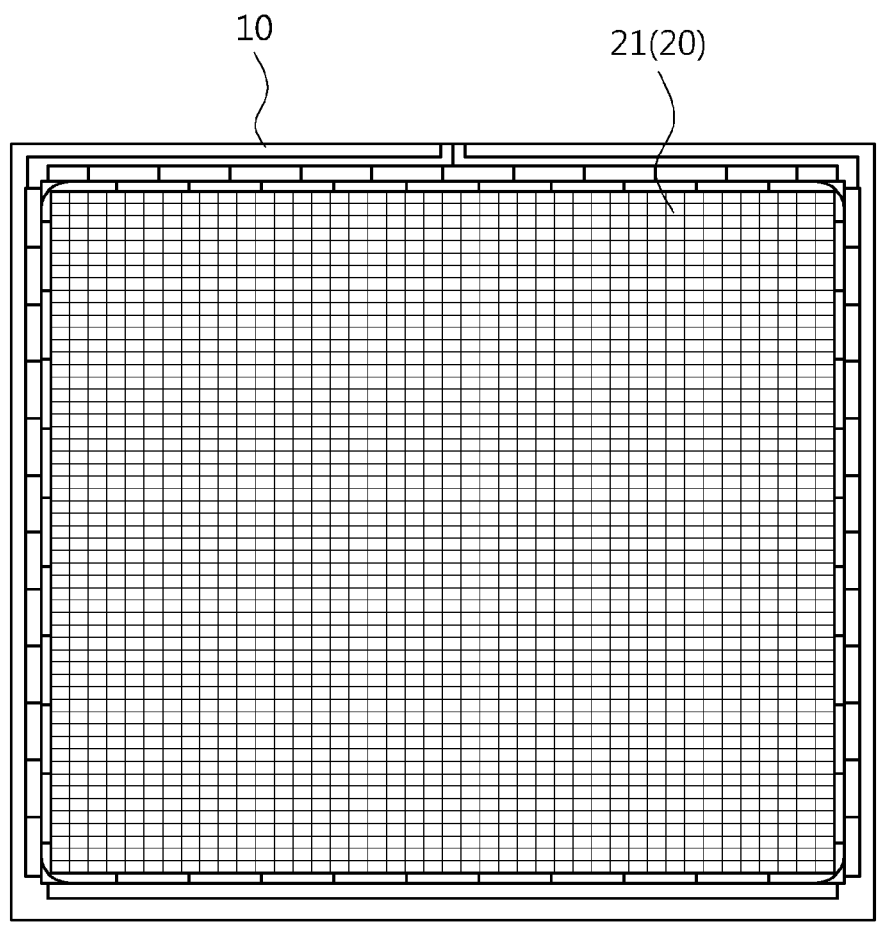
FIG. 1 is a view of a digitizer employing a flexible printed circuit board according to the present invention.

Referring to FIG. 1, the flexible printed circuit board according to the present invention is given as a digitizer in which a coordinate pattern 21 is established with a plurality of intersecting X and Y axes. In one exemplary embodiment, the circuit pattern 20 is a coordinate pattern 21.

Typically designed to be installed in a display panel, the digitizer comprises a substrate 10 that has a size corresponding to that of the display panel and across which a coordinate pattern 21 is uniformly formed, so as to accurately represent coordinates of a point at which a touch is made.

Given a high specific resistivity, the circuit pattern consumes a large amount of electric power, with the consequent generation of a large amount of heat. Hence, the circuit pattern preferably has a specific resistivity of 6.5μΩ·cm less. A lower specific resistivity is more preferable. Particularly, since the coordinate pattern 21 is formed uniformly across the substrate 10 in the digitizer, the circuit pattern preferably has a specific resistivity equal to or lower than the value, that is, 6.5μΩ·cm.

In the flexible printed circuit board of the present invention, the specific resistivity of the circuit pattern preferably ranges from 4.0 μΩ·cm to 6.5 μΩ·cm. This specific resistivity range guarantees the circuit pattern bond strength and peel-off strength after plating if the sintering temperature range is maintained, as will be explained in the description for the manufacturing method with reference to test data.

In a preferred exemplary embodiment of the present invention, the flexible printed circuit board may further comprise a plating layer formed on terminals of the circuit pattern. Through the terminals, the circuit pattern is electrically connected with other or different flexible circuit boards, or other electronic parts. The plating layer increases the connecting junctions of the circuit pattern in rigidity, guaranteeing the reliability of the junctions.

Figure 2:
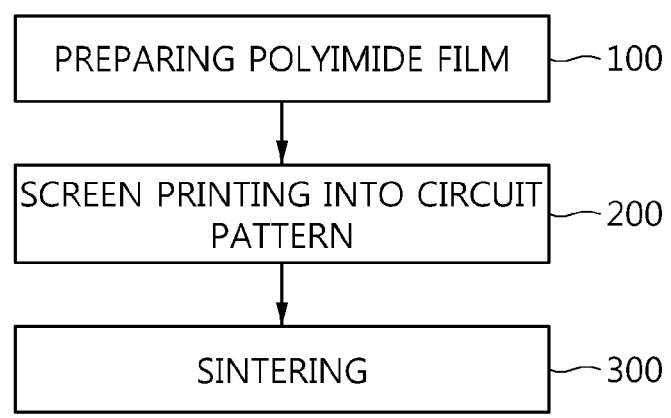
FIG. 2 is a process flow illustrating a method for manufacturing a flexible printed circuit board in accordance with the present invention.

With reference to FIG. 2, a method for manufacturing a flexible printed circuit board in accordance with the present invention comprises forming a circuit pattern with conductive paste on one side of a substrate (200); and sintering the circuit pattern at 290° C.~420° C. (300).

The method for manufacturing a flexible printed circuit board in accordance with the present invention may further comprise preparing a polyimide film as the substrate (100).

Preferably, the circuit pattern forming step (200) may be achieved by screen printing the circuit pattern. By screen printing, the circuit pattern can be established with conductive paste at low cost and at high production rate.

In an exemplary embodiment of the circuit pattern forming step (200), a coordinate pattern composed of a plurality of intersecting X-Y axes may be formed.

The polyimide film does not undergo deformation and damage upon heating at 290° C.~420° C., so that it can retain its original morphology after sintering the printed conductive paste, and thus allows the sintered circuit pattern to be attached thereto stably.

However, it should be understood for those skilled in the art that the substrate may be selected from among various any flexible synthetic resin films so long as they are not deformed at a sintering temperature of 400° C. or higher.

The conductive paste may be preferably silver paste comprising a silver powder, a polymer resin, and a solvent. The silver paste comprises a silver powder in an amount of 73 wt %~88 wt %, a polymer resin in an amount of 5.9 wt % 9.5 wt %, and a solvent in an amount of 5.7 wt %~18.0 wt %.

The silver paste may further comprise a dispersant in an amount of 0.35 wt %~2.90 wt %.

In one exemplary embodiment, the polymer resin includes a polyester-based resin having a molecular weight of approximately 25,000.

Although developed for use at high temperatures, polyimide films may shrink, deform, and carbonize when they are heated to a temperature over the limit. As the temperature at which the conductive paste comprising a silver powder is sintered increases, the silver powder is more apt to adhere to each other after sintering. At a high sintering temperature, in addition, the conductive paste decreases in resistance as the materials increasing electric conductivity, such as the polymer resin and the solvent, are removed.

In full consideration of properties of the polyimide film and the conductive paste, therefore, the sintering temperature should be determined.

According to the present invention, a sintering temperature of 290° C.~420° C. is adapted to reduce the resistance of the coordinate pattern that is formed on the polyimide firm by screen printing.

In an exemplary embodiment of the sintering step (300), the substrate, and the circuit pattern screen printed on one side of the substrate is sintered at 290° C.~420° C., using a BTU Tunnel furnace or a Lindberg Box furnace.

The method for manufacturing a flexible printed circuit board in accordance with the present invention may further comprise plating terminals of the circuit pattern after the sintering step (300).

In the plating step, the terminals are plated with a highly conductive metal, such as copper, silver, gold, etc. Through the terminals, the circuit pattern is electrically connected with other or different flexible circuit boards, or other electronic parts. The plating layer increases the connecting junctions of the circuit pattern in rigidity, thereby guaranteeing the reliability of the junctions.

Examination was made of the effect of sintering temperatures on specific resistivity, and bond strength and peel strength. For this, the same silver paste was printed into circuit patterns on a polyimide film, and the circuit patterns were sintered at different temperatures. The resulting sintered circuit patterns were measured for specific resistivity. In addition, the bond strength and the peel-off strength after plating of the sintered circuit patterns were measured and are expressed as "good" or "poor". This test data is summarized in Table 1, below.

In Examples 1 to 13 and Comparative Examples 1 and 2 of Table 1, the same silver paste comprising 87 wt % of a silver powder, 6 wt % of a polymer resin, and 7 wt % of a solvent was used to form identical circuit patterns on a polyimide film, followed by sintering the circuit patterns at respective temperatures to give flexible printed circuit boards. In this context, the silver power was identical in particle size distribution, mean particle size, and average density among the silver pastes used.

the polyimide film after the step of plating the terminals. It was measured using tapes with an adhesive strength of 750 f/cm~1250 f/cm, and expressed as "Good or Poor".

As an assay for bond strength, a tape having an adhesive strength of 750 f/cm 1250 f/cm was applied to a sintered circuit pattern printed on a polyimide film, and detached from the sintered circuit pattern. The bond strength of the circuit pattern was determined to be good when no parts of the circuit pattern were attached to the polyimide film, and poor when any part of the circuit pattern was separated from the polyimide film.

Likewise, for an assay for peel-off strength after plating, a tape having an adhesive strength of 750 f/cm 1250 f/cm was applied to a plated portion of a sintered circuit pattern printed on a polyimide film, and detached from the sintered circuit pattern. The bond strength of the circuit pattern was determined to be good when none of the plated portion were attached to the tape, and poor when any part of the circuit pattern was separated from the polyimide film.

Therefore, the sintering step (300) is preferably performed at a temperature of 290° C. 420° C., and more preferably at a temperature of 310° C.~410° C.

TABLE 1

| Ex. No. | Silver powder (wt %) | Polymer resin (wt %) | Solvent (wt %) | Sintering Temp. (° C.) | Sintering Time (min) | Specific Resistivity (μΩ · cm) | Bond Strength | Peel-off strength after plating |
|---|---|---|---|---|---|---|---|---|
| C. 1 | 87.0 | 6.0 | 7.0 | 280 | 30 | 6.83 | Good | Good |
| 1 | 87.0 | 6.0 | 7.0 | 290 | 30 | 6.34 | Good | Good |
| 3 | 87.0 | 6.0 | 7.0 | 300 | 30 | 6.24 | Good | Good |
| 3 | 87.0 | 6.0 | 7.0 | 310 | 30 | 5.66 | Good | Good |
| 4 | 87.0 | 6.0 | 7.0 | 320 | 30 | 5.42 | Good | Good |
| 5 | 87.0 | 6.0 | 7.0 | 330 | 30 | 5.33 | Good | Good |
| 6 | 87.0 | 6.0 | 7.0 | 350 | 30 | 4.77 | Good | Good |
| 7 | 87.0 | 6.0 | 7.0 | 360 | 30 | 4.51 | Good | Good |
| 8 | 87.0 | 6.0 | 7.0 | 370 | 30 | 4.43 | Good | Good |
| 9 | 87.0 | 6.0 | 7.0 | 380 | 30 | 4.27 | Good | Good |
| 10 | 87.0 | 6.0 | 7.0 | 390 | 30 | 4.15 | Good | Good |
| 11 | 87.0 | 6.0 | 7.0 | 400 | 30 | 4.09 | Good | Good |
| 12 | 87.0 | 6.0 | 7.0 | 410 | 30 | 3.79 | Good | Good |
| 13 | 87.0 | 6.0 | 7.0 | 420 | 30 | 3.54 | Good | Poor |
| C. 2 | 87.0 | 6.0 | 7.0 | 430 | 30 | 3.50 | Poor | Poor |

As is understood from data of Table 1, when the circuit patterns were sintered at lower than 290° C., the specific resistivity exceeded the critical value 6.5 μΩ·cm while at a sintering temperature of 420° C., the circuit pattern had a decreased specific resistivity, and good bond strength with regard to the polyimide film, but exhibited poor peel-off strength after plating. When the sintering temperature exceeded 420° C., the circuit pattern decreased in specific resistivity, but was poor in both bond strength and peel-off strength after plating.

With reference to data of Table 1, the sintering step (300) may be preferably carried out at 290° C.~420° C., and more preferably at 310° C.~410° C. The sintering temperature range is set not only to limit the specific resistivity of the sintered circuit pattern within the desirable predetermined range, but also to guarantee satisfactory bond strength and peel-off strength after plating with regard to the polyimide film.

The bond strength refers to the bond strength of the circuit pattern with regard to the polyimide after the sintering step (300). It was measured using tapes with an adhesive strength of 750 f/cm~1250 f/cm, and expressed as "Good or Poor".

The peel-off strength after plating refers to the peel-off strength of the terminals of the circuit pattern with regard to In another preferred exemplary embodiment of the present invention, the sintering step (300) is preferably carried out for 10 min to 35 min at a temperature of 290° C.~420° C.

Examination was made of the effect of sintering time on specific resistivity, and bond strength and peel strength. For this, the same silver paste was printed into circuit patterns on a polyimide film, and the circuit patterns were sintered for different time periods. The resulting sintered circuit patterns were measured for specific resistivity. In addition, the bond strength and the peel-off strength after plating of the sintered circuit patterns were measured and are expressed as "good" or "poor". This test data is summarized in Table 2, below.

In Examples 14 to 19 and Comparative Examples 3 and 4 of Table 1, the same silver paste comprising 87 wt % of a silver powder, 6 wt % of a polymer resin, and 7 wt % of a solvent was used to form identical circuit patterns on a polyimide film, followed by sintering the circuit patterns for respective time periods to give flexible printed circuit boards. In this context, the silver power was identical in particle size distribution, mean particle size, and average density among the silver pastes used.

TABLE 2

| Ex. No. | Silver powder (wt %) | Polymer resin (wt %) | Solvent (wt %) | Sintering Temp. (° C.) | Sintering Time (min) | Specific Resistivity (μΩ·cm) | Bond Strength | Peel-off strength after plating |
|---|---|---|---|---|---|---|---|---|
| C. 3 | 87.0 | 6.0 | 7.0 | 350 | 5  | 6.83 | Good | Good |
| 14   | 87.0 | 6.0 | 7.0 | 350 | 10 | 6.64 | Good | Good |
| 15   | 87.0 | 6.0 | 7.0 | 350 | 15 | 6.48 | Good | Good |
| 16   | 87.0 | 6.0 | 7.0 | 350 | 20 | 5.66 | Good | Good |
| 17   | 87.0 | 6.0 | 7.0 | 350 | 25 | 5.42 | Good | Good |
| 18   | 87.0 | 6.0 | 7.0 | 350 | 30 | 4.77 | Good | Good |
| 19   | 87.0 | 6.0 | 7.0 | 350 | 35 | 4.25 | Good | Poor |
| C. 4 | 87.0 | 6.0 | 7.0 | 350 | 40 | 4.08 | Poor | Poor |

As is understood from data of Table 2, when the circuit patterns were sintered for less than 10 min, the specific resistivity exceeded the critical value 6.5 μΩ·cm while when sintered for 35 min, the circuit pattern had specific resistivity below the critical value, but exhibited poor peel-off strength after plating. When the sintering was performed for 40 min, the circuit pattern decreased in specific resistivity below the critical value, but was poor in both bond strength and peel-off strength after plating.

Accordingly, the sintering step (300) may be preferably carried out at 290° C.~420° C. for 10 min~35 min, and more preferably for 20~30 min.

Examination was made of the effect on specific resistivity, and bond strength and peel strength of silver paste compositions in which a silver powder, a polymer resin, and solvent were mixed at various weight ratios. For this, different silver pastes were printed into circuit patterns on a polyimide film, and the circuit patterns were sintered. The resulting sintered circuit patterns were measured for specific resistivity. In addition, the bond strength and the peel-off strength after plating of the sintered circuit patterns were measured and are expressed as "good" or "poor". This test data is summarized in Table 3, below.

In Examples 20 to 31 and Comparative Examples 5 and 6 of Table 3, silver pastes comprising a silver powder in an amount of 73 wt %~90 wt %, a polymer resin in an amount of 2.5 wt %~12.5 wt %, and a solvent in an amount of 5.7 wt %~18.5 wt % were used to form identical circuit patterns on a polyimide film, followed by sintering the circuit patterns at 350° C. to give flexible printed circuit boards.

TABLE 3

| Ex. No. | Silver Powder (wt %) | Polymer Resin (wt %) | Solvent (wt %) | Sintering Temp. (° C.) | Sintering Time (min) | Specific Resistivity (μΩ·cm) | Bond Strength | Peel-off strength after plating |
|---|---|---|---|---|---|---|---|---|
| C. 5  | 87.0 | 2.5  | 10.5 | 350 | 25 | 3.57  | Poor | Poor |
| C. 6  | 87.0 | 2.8  | 10.2 | 350 | 25 | 3.71  | Poor | Poor |
| C. 7  | 87.0 | 3.0  | 10.0 | 350 | 25 | 3.78  | Poor | Poor |
| C. 8  | 85.0 | 3.0  | 12.0 | 350 | 25 | 3.80  | Poor | Poor |
| C. 9  | 87.0 | 3.3  | 9.7  | 350 | 25 | 3.77  | Poor | Poor |
| C. 10 | 87.0 | 3.5  | 9.5  | 350 | 25 | 3.92  | Poor | Poor |
| C. 11 | 90.0 | 3.7  | 6.3  | 350 | 25 | 3.88  | Poor | Poor |
| C. 12 | 87.0 | 5.3  | 7.7  | 350 | 25 | 4.80  | Poor | Poor |
| C. 13 | 88.0 | 5.7  | 6.3  | 350 | 25 | 4.53  | Poor | Poor |
| 20    | 88.0 | 5.9  | 6.1  | 350 | 25 | 4.46  | Good | Poor |
| 21    | 83.0 | 6.0  | 11.0 | 350 | 25 | 4.51  | Good | Good |
| 22    | 85.0 | 6.0  | 9.0  | 350 | 25 | 4.45  | Good | Good |
| 23    | 87.0 | 6.0  | 7.0  | 350 | 25 | 4.39  | Good | Good |
| 24    | 74.0 | 6.3  | 19.7 | 350 | 25 | 4.92  | Good | Good |
| 25    | 83.0 | 6.3  | 10.7 | 350 | 25 | 3.89  | Good | Good |
| 26    | 80.0 | 7.5  | 12.5 | 350 | 25 | 5.68  | Good | Good |
| 27    | 78.0 | 9.5  | 12.5 | 350 | 25 | 5.72  | Good | Good |
| 28    | 77.0 | 9.5  | 13.5 | 350 | 25 | 5.79  | Good | Good |
| 29    | 760. | 9.5  | 14.5 | 350 | 25 | 5.84  | Good | Good |
| 30    | 75.0 | 9.5  | 15.5 | 350 | 25 | 5.98  | Good | Good |
| 31    | 73.0 | 9.5  | 17.5 | 350 | 25 | 6.48  | Good | Good |
| C. 14 | 70.0 | 9.5  | 18.5 | 350 | 25 | 7.01  | Good | Good |
| C. 15 | 75.0 | 10.2 | 14.8 | 350 | 25 | 12.07 | Good | Good |
| C. 16 | 80.0 | 12.5 | 7.5  | 350 | 25 | 13.53 | Good | Good |

As is understood from data of Table 3, when the silver paste contained silver powder in an amount of 73 wt %~88 wt %, a polymer resin in an amount of 5.9 wt %~9.5 wt %, and a solvent in an amount of 5.7 wt %~18.0 wt %, the circuit patterns showed a specific resistivity of 4.0 μΩ·cm to 6.5 μΩ·cm, with excellence in both bond strength and peel-off strength after plating with regard to the polyimide film.

Given a silver powder content less than 73 wt %, the silver paste sintered at 290° C.~420° C. was observed to decrease in conductivity, and increase in specific resistivity to the extent exceeding the predetermined value.

On the other hand, when the silver powder was contained in an amount larger than 88 wt %, contents of both the polymer resin and the solvent were correspondingly decreased, which had negative influences on bond strength and peel-off strength after plating with regard to the polyimide film.

When the silver paste contained a polymer resin in an amount less than 5.9 wt %, the circuit pattern that was screen printed from the silver paste and sintered was poor in bond strength with regard to the polyimide film. At a polymer resin content higher than 9.5 wt % in the silver paste, the resulting circuit pattern had undesirably high specific resistivity.

In addition, a content of the solvent in the silver paste preferably ranges from 5.7 wt % to 18.0 wt % in order to mix the silver powder and the polymer resin and to give a suitable viscosity to the mixture. When contained in this content range, the solvent allows the silver paste to be printed into accurate circuit pattern forms, and is evaporated at a sintering temperature of 290° C.~420° C., so as to minimally affect the specific resistivity.

Examination was made of the effect of contents of a dispersant and a solvent on specific resistivity, and bond strength and peel strength. For this, various silver pastes in which a dispersant and a solvent were mixed at various weight ratios, with a fixed ratio between a silver powder and a polymer resin, were printed into circuit patterns on a polyimide film, and the circuit patterns were sintered. The resulting sintered circuit patterns were measured for specific resistivity. In addition, the bond strength and the peel-off strength after plating of the sintered circuit patterns were measured and are expressed as "good" or "poor". This test data is summarized in Table 4, below.

In Examples 32 to 44 and Comparative Examples 17 and 18 of Table 4, silver pastes comprising 85 wt %, of a silver powder, 5 wt % of a polymer resin, and various weight ratios between a dispersant and a solvent were used to form identical circuit patterns on a polyimide film, followed by sintering the circuit patterns at 350° C. to give flexible printed circuit boards.

Although containing a polymer resin in an amount of 5 wt %, the silver pastes of Examples 32 to 44 and Comparative Examples 17 and 18 guaranteed the circuit patterns good bond strength and peel-off strength after plating with regard to the polyimide film.

Preferably, a dispersant is further contained in an amount of 0.35 wt %~2.90 wt % in the silver paste, contributing to the improvement of the sintered circuit pattern in bond strength and peel-off strength after plating with regard to the polyimide film.

Examination was made of the effect of the particle size distribution of a silver powder on specific resistivity, and bond strength and peel strength. For this, various silver pastes that had the same composition, but were different in the particle size distribution of the silver powder were printed into circuit patterns on a polyimide film, and the circuit patterns were sintered at the same temperature. The resulting sintered circuit patterns were measured for specific resistivity. In addition, the bond strength and the peel-off strength after plating of the sintered circuit patterns were measured and are expressed as "good" or "poor". This test data is summarized in Table 5, below.

In Table 5, a silver powder having a particle size distribution of 0.1~3.0 μm with a mean particle size of 1.0~1.2 μm was used in Example 45; a silver powder having a particle size distribution of 0.1~3.0 μm with a mean particle size of 0.5~0.6 μm in Example 46; a silver powder having a particle size distribution of 0.2~4.0 μm with a mean particle size of 1.0~1.2 μm in Example 47; a silver powder having a particle size distribution of 0.2~4.0 μm with a mean particle size of 0.5~0.6 μm in Example 48; a silver powder

TABLE 4

| Ex. No. | Silver Powder (wt %) | Dispersant (wt %) | Polymer resin (wt %) | Solvent (wt %) | Sintering Temp. (° C.) | Sintering Time (min) | Specific Resistivity (μΩ · cm) | Bond Strength | Peel-off Strength after Plating |
|---|---|---|---|---|---|---|---|---|---|
| C. 17 | 85.0 | 0.35 | 5.0 | 9.65 | 350 | 15 | 4.53 | Good | Poor |
| 32 | 85.0 | 0.50 | 5.0 | 9.50 | 350 | 15 | 4.52 | Good | Good |
| 33 | 85.0 | 0.70 | 5.0 | 9.30 | 350 | 15 | 4.52 | Good | Good |
| 34 | 85.0 | 0.80 | 5.0 | 9.20 | 350 | 15 | 4.57 | Good | Good |
| 35 | 85.0 | 0.90 | 5.0 | 9.10 | 350 | 15 | 4.59 | Good | Good |
| 36 | 85.0 | 1.00 | 5.0 | 9.00 | 350 | 15 | 4.58 | Good | Good |
| 37 | 85.0 | 1.10 | 5.0 | 8.90 | 350 | 15 | 4.60 | Good | Good |
| 38 | 85.0 | 1.20 | 5.0 | 8.80 | 350 | 15 | 4.71 | Good | Good |
| 39 | 85.0 | 1.30 | 5.0 | 8.70 | 350 | 15 | 4.43 | Good | Good |
| 40 | 85.0 | 1.40 | 5.0 | 8.60 | 350 | 15 | 4.52 | Good | Good |
| 41 | 85.0 | 1.50 | 5.0 | 8.50 | 350 | 15 | 4.66 | Good | Good |
| 42 | 85.0 | 2.00 | 5.0 | 8.00 | 350 | 15 | 4.89 | Good | Good |
| 43 | 85.0 | 2.10 | 5.0 | 7.90 | 350 | 15 | 4.87 | Good | Good |
| 44 | 85.0 | 2.90 | 5.0 | 7.10 | 350 | 15 | 4.89 | Good | Poor |
| C. 18 | 85.0 | 3.00 | 5.0 | 7.00 | 350 | 15 | 5.02 | Poor | Poor |

As shown in Table 4, the dispersant was observed to have no significant influences on the specific resistivity. The dispersant influenced the rheology and viscosity of the silver paste, particularly, the bond strength and peel-off strength after plating of the circuit pattern with regard to the polyimide film.

having a particle size distribution of 0.3~4.5 μm with a mean particle size of 1.0~1.2 μm in Example 49; a silver powder having a particle size distribution of 0.3~4.5 μm with a mean particle size of 0.5~0.6 μm in Example 50; a silver powder having a particle size distribution of 0.5~5.0 μm with a mean particle size of 1.5~2.0 μm in Comparative Example 19.

TABLE 5

| Ex. No. | Silver Powder (wt %) | Silver powder Particle Size (μm) | Silver Powder Mean Size (μm) | Polymer Resin (wt %) | Solvent (wt %) | Sintering Temp. (° C.) | Specific Resistivity (μΩ · cm) | Bond Strength | Peel-off Strength After Plating |
|---|---|---|---|---|---|---|---|---|---|
| 45 | 87.0 | 0.1~3.0 | 1.0~1.2 | 6.3 | 6.7 | 350 | 5.71 | Good | Good |
| 46 | 87.0 | 0.1~3.0 | 0.5~0.6 | 6.3 | 6.7 | 350 | 5.69 | Good | Good |
| 47 | 87.0 | 0.2~4.0 | 1.0~1.2 | 6.3 | 6.7 | 350 | 5.66 | Good | Good |

TABLE 5-continued

| Ex. No. | Silver Powder (wt %) | Silver powder Particle Size (μm) | Silver Powder Mean Size (μm) | Polymer Resin (wt %) | Solvent (wt %) | Sintering Temp. (° C.) | Specific Resistivity (μΩ · cm) | Bond Strength | Peel-off Strength After Plating |
|---|---|---|---|---|---|---|---|---|---|
| 48 | 87.0 | 0.2~4.0 | 0.5~0.6 | 6.3 | 6.7 | 350 | 5.66 | Good | Good |
| 49 | 87.0 | 0.3~4.5 | 1.0~1.2 | 6.3 | 6.7 | 350 | 5.79 | Good | Good |
| 50 | 87.0 | 0.3~4.5 | 0.5~0.6 | 6.3 | 6.7 | 350 | 5.72 | Good | Good |
| C. 19 | 87.0 | 0.5~5.0 | 0.5~5.0 | 6.3 | 6.7 | 350 | 6.78 | Good | Good |

As is understood from data of Table 5, the silver powder used in the silver paste preferably has a particle size distribution of 0.1~4.5 μm. When the silver powder had this particle size distribution, the circuit patterns showed a specific resistivity of 4.0 μΩ·cm to 6.5 μΩ·cm, with excellence in both bond strength and peel-off strength after plating with regard to the polyimide film.

Silver powders with smaller particle sizes more easily move, more readily aggregate together upon sintering, and thus show lower resistance. However, when their sizes decrease below 0.1 μm, silver powders cannot further reduce in resistivity, but become poor in cost-to-benefit ratio. On the other hand, when their sizes exceed 5 μm, the silver powders are less prone to aggregate together, thus making it difficult to reduce the resistivity below the critical value.

More preferably, the silver powder has a particle size distribution of 0.2~3.0 μm. When the silver powder having the particle size distribution is used, the specific resistivity can be effectively reduced with low cost. That is, the particle size distribution guarantees a suitable specific resistivity at low cost.

In addition, the silver particle preferably has a spherical morphology. Since the coordinate pattern is narrow in line width and in distance between lines, spherical silver powders are useful for printing accurate coordinate patterns.

Examination was made of the effect of the mean particle size of a silver powder on specific resistivity, and bond strength and peel strength. For this, various silver pastes that were identical in composition and particle size distribution, but different in the mean particle size of the silver powder were printed into circuit patterns on a polyimide film, and the circuit patterns were sintered at the same temperature. The resulting sintered circuit patterns were measured for specific resistivity. In addition, the bond strength and the peel-off strength after plating of the sintered circuit patterns were measured and are expressed as "good" or "poor". This test data is summarized in Table 6, below.

In Table 5, a silver powder ranged in mean particle size from 0.5 to 0.6 μm in Example 51; from 1.0 to 1.2 μm in Example 52; from 1.8 to 2.0 μm in Example 53; from 2.1 to 2.3 μm in Example 54; and from 2.5 to 2.7 μm in Comparative Example 20.

As is understood from data of Table 6, the silver powder used in the silver paste preferably has a mean particle size of 0.5~2.3 μm. When the silver powder had this mean particle size, the circuit patterns showed a specific resistivity of 4.0 μΩ·cm to 6.5 μΩ·cm, with excellence in both bond strength and peel-off strength after plating with regard to the polyimide film. More preferably, the silver powder has a mean particle size distribution of 0.5~1.2 μm. When the silver powder having the mean particle size is used, the specific resistivity can be effectively reduced with low cost. That is, the mean particle size guarantees a suitable specific resistivity at low cost.

Compared to conventional etching techniques for FCCL, as described above, the present invention can manufacture a flexible printed circuit board more simply and easily and thus at lower production cost, with higher productivity.

Capable of forming a circuit pattern without a plating process, the present invention is free of the problem of circuit pattern delamination encountered with a plating process, and thus can improve the reliability of the final product.

Since the circuit pattern meets the resistivity standard after sintering even at a low temperature, the present invention avoids the problems of heat generation and power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a flexible printed circuit board, comprising:
   screen printing a circuit pattern with conductive paste on one side of a flat polyamide film; and
   sintering the circuit pattern at 290° C.~420° C.;
   wherein the conductive paste is a silver paste comprising a silver powder in an amount of from 73 wt % to 88 wt %, a polymer resin in an amount of from 5.9 wt % to 9.5 wt %, and a solvent in an amount of from 5.7 wt % to 18.0 wt %; the silver powder ranges in mean size

TABLE 6

| Ex. No. | Silver powder (wt %) | Silver powder Particle Size (μm) | Silver powder Mean Size (μm) | Polymer Resin (wt %) | Solvent (wt %) | Sintering Temp. (° C.) | Specific Resistivity (μΩ · cm) | Bond Strength | Peel-off Strength after Plating |
|---|---|---|---|---|---|---|---|---|---|
| 51 | 87.0 | 0.2~4.0 | 0.5~0.6 | 6.3 | 6.7 | 350 | 4.93 | Good | Good |
| 52 | 87.0 | 0.2~4.0 | 1.0~1.2 | 6.3 | 6.7 | 350 | 5.54 | Good | Good |
| 53 | 87.0 | 0.2~4.0 | 1.8~2.0 | 6.3 | 6.7 | 350 | 5.96 | Good | Good |
| 54 | 87.0 | 0.2~4.0 | 2.1~2.3 | 6.3 | 6.7 | 350 | 6.14 | Good | Good |
| C. 20 | 87.0 | 0.2~4.0 | 2.5~2.7 | 6.3 | 6.7 | 350 | 6.54 | Good | Good | from 0.5 to 1.2 μm, and the circuit pattern after the sintering has a specific resistivity in a range of from 4.0 μΩ·cm to 6.5 μΩ·cm.

2. The method of claim 1, wherein the sintering of the circuit pattern is carried out at 310° C.~410° C.

3. The method of claim 1, wherein the sintering of the circuit pattern is carried out for a period of 10 min~35 min.

4. The method of claim 1, wherein the sintering is achieved by heating the circuit pattern for 20~30 min.

5. The method of claim 1, wherein the silver paste further comprises a dispersant in an amount of 0.35 wt %~2.90 wt %.

* * * * *